United States Patent [19]

Gordon

[11] Patent Number: 5,895,554
[45] Date of Patent: Apr. 20, 1999

[54] ALIGNMENT METHOD AND APPARATUS FOR MOUNTING ELECTRONIC COMPONENTS

[76] Inventor: Thomas A. Gordon, 12044 Rue Des Amis, San Diego, Calif. 92131

[21] Appl. No.: 08/804,353

[22] Filed: Feb. 21, 1997

[51] Int. Cl.⁶ .............................. H01R 9/09; H05K 3/34; B32B 31/06
[52] U.S. Cl. .................. 156/556; 228/49.1; 228/180.22; 228/185; 29/740; 29/834; 361/777
[58] Field of Search .............................. 156/556; 29/740, 29/834; 228/49.1

[56] References Cited

U.S. PATENT DOCUMENTS

| | | | |
|---|---|---|---|
| 3,516,155 | 6/1970 | Smith | 29/626 |
| 4,479,298 | 10/1984 | Hug | 29/589 |
| 4,512,509 | 4/1985 | Ellis, Jr. et al. | 228/180 |
| 4,528,747 | 7/1985 | Hoffman et al. | 29/834 |
| 4,531,277 | 7/1985 | Beltz et al. | 29/466 |
| 4,705,205 | 11/1987 | Allen et al. | 228/180 |
| 4,975,143 | 12/1990 | Drake et al. | 156/633 |
| 4,985,107 | 1/1991 | Conroy et al. | 156/299 |
| 5,201,451 | 4/1993 | Desai et al. | 228/5.5 |
| 5,205,032 | 4/1993 | Kuroda et al. | 29/740 |
| 5,526,974 | 6/1996 | Gordon et al. | 228/103 |
| 5,796,590 | 8/1998 | Klein | 361/774 |

*Primary Examiner*—David A. Simmons
*Assistant Examiner*—Sue Purvis
*Attorney, Agent, or Firm*—John R. Duncan; Frank D. Gilliam

[57] ABSTRACT

A method and apparatus for aligning an electronic component with a base member where a pattern of contacts on the component are to be bonded to an identical pattern of contacts on the base member. Templates having indentations along one edge shaped to align with the contact pattern on the component and base member can be positioned in alignment with the base member contact pattern along two sides of the pattern and releasably secured in place, such as by tape. The component is placed over the base member with its contacts aligned with the template. This assures precise alignment of the two contact patterns. The assembly can be heated to the melting point of the solder and cooled to bond all of the contacts together. The templates are removed for reuse. With ball grid array components, the template indentations are preferably partially-circular to align with the edge row of round solder contact pads. With linear arrays of short elongated solder pads, preferably the template has plural spaced fingers configured to fit between the solder pads.

15 Claims, 3 Drawing Sheets

ALIGNMENT METHOD AND APPARATUS FOR MOUNTING ELECTRONIC COMPONENTS

FIELD OF THE INVENTION

This invention relates to apparatus for aligning ball grid array and similar components on a printed circuit board during manufacture or rework.

BACKGROUND OF THE INVENTION

Originally, printed circuit boards included plated holes into which leads of electronic components were inserted and soldered. Currently, circuit boards tend to have closely spaced surface pads with the component simply placed on the board with leads in contact with the pads, to which the leads are then soldered. Typically of these are ball grid array and quad flat pack contact systems or any other arrangement in which a plurality of leads along one or more sides of a component are to be soldered to a mounting board.

The pattern of closely spaced contact pads for connection to component leads are usually formed on the printed circuit board base by silkscreening techniques. The pattern is typically in the form of a rectangular row or multi-row pattern, conforming to the leads along the peripheral edge or underside of an electronic component. After board fabrication and during assembly operations, a thin stencil having holes conforming to the pad pattern is placed over the pad array and precisely aligned therewith. A solder paste made up of very small solder balls in a slurry of flux and other ingredients is wiped over the stencil with a squeegee, forcing small amounts of paste through the holes onto the pads. The stencil is lifted away leaving a coating of the paste on the pads. The components must then be very precisely placed on the board with the component leads aligned with the pads. Accuracies on the order of 0.0005 inch are often required. Once the component is placed, the solder is melted, generally in an infrared or convection oven, and solder bonds are formed between the pad and lead.

In reworking a printed circuit board, a component is heated to melt the solder bonds and the component is lifted away. Solder "icicles" may extend from the printed circuit solder pads and some pads may be left with excessive or insufficient solder. The pads are repaired by such techniques as locally heating pads and wicking away excessive solder or adding additional solder with a solder pen.

Very large, very expensive, robotic machines have been developed for accurately placing components on such surface mount boards with leads precisely aligned and soldering the leads to the pads in very high volume manufacturing operations. These machines make use of extremely expensive vision alignment equipment and other optical devices to precisely locate the components. These large and complex machines require considerable operator training and the component and board designs cannot be rapidly and easily changed. Exemplary of such machines is that described by Takahashi et al. in U.S. Pat. No. 4,292,116. Such large devices are not economically feasible, or well adapted to, low to medium volume operations where only a few fine pitch parts are placed on relatively few boards or for rework of components removed from such boards.

Many integrated circuit components have a row of very closely spaced contacts around the component periphery. Other components have an array of copper pads across the underside of the components in rows and columns at various pitch locations in a grid array. Bumps or balls of solder are provided on the copper pads to make interconnect points (a ball grid array) for attachment of the component to a corresponding pattern on a circuit board.

The component can be fastened to a printed circuit board by normal surface mount processes. Very precise alignment of the component contacts with the board contacts is essential because of the small size and close spacing of the contacts.

Sometimes ball grid array components must be removed from a printed circuit board for rework of the overall board. Because of the density of the component connections, the components are usually quite expensive, so that the ability to repair and re-use them is important. Desoldering tools and heat profiles have been developed for removing components from a printed circuit board that will retain most, but generally not all, high temperature solder balls on the component pads. With low temperature solder balls that melted during mounting the entire component must be reballed. In some cases, solder bridges will form between pads so that solder will have to be completely wiped or wicked off of the pads.

Reballing is often done with small tools used in a manner that essentially mimics the original manufacturing method of balling parts. A first screen is positioned over the contact pad array, a flux paste or solder paste is wiped over the screen to add flux to the pad array, then the screen is removed. A second screen with larger holes is placed over the part and pre-formed solder balls are gravity loaded through the stencil with any excess solder balls shaken off. The second screen is removed and part is reflowed upside down in an oven. This is a very time consuming process and requires considerable skill.

Thus, there is a continuing need for improved methods and apparatus for aligning an electronic component having a ball grid array of contacts or rows of edge contacts with a corresponding array of solder pads on a printed circuit board which will provide for accurate, rapid and convenient replacement of components during assembly rework or low rate manufacturing.

SUMMARY OF THE INVENTION

The above noted problems, and others, are overcome by a method and apparatus for aligning a multiple contact electronic component with corresponding contact patterns on a printed circuit board or the like. While particularly useful in the repair or rework of printed circuit boards bearing plural components where it becomes necessary to remove and replacement of electronic components, the method and apparatus is also suitable for short run or specialized manufacture of such boards.

The apparatus basically comprises two thin templates of sheet material, typically stainless steel that is not wet by solder, each having indentations along a first side corresponding in size and configuration to the contacts on the printed circuit board and electronic component. In the case of ball grid arrays and the like having a grid-like pattern of round printed circuit board pads and corresponding generally spherical balls or bumps on the electronic component, the templates will preferably have a series or precisely corresponding partial circular (optimally semicircular) indentations along the first edge of the template to match the circular pad and balls. In the case of components using edge arrays of closely spaced wires corresponding to linear arrays closely spaced, parallel, elongated pads (as, for example, in quad flat packs), the indentations may be a linear array of narrow slots bounded by extending fingers or a single long indentation along the entire length of the linear array or may have a series of small rounded indentations corresponding to the end of each elongated pad.

Templates are place on the printed circuit board along two sides of the contact pattern, preferably on opposite sides. If other components on the board interfere, the templates can be trimmed to avoid the interfering components. The template indentations are carefully visually aligned with the board contact array and are releasably bonded to the board. While any suitable releasable bonding technique may be used, using pieces of pressure sensitive tape pressed over the template edge and board is preferred. For best results where the assembly is heated to melt solder, polyimide tape of the sort available under the Kapton® trademark is preferred. For most effective and convenient taping, tabs are preferred at each end of each template extending away from the second edge of the template in the plane of the template so that tape can be placed entirely across the tab and bond to the board on both sides of each tab.

When this system is used for repair or rework, the solder pads are initially prepared by removing any excess solder from pads or adding any needed solder. Flux is applied in a conventional manner. The templates are visually aligned with the board contacts and taped in place. The electronic component is placed on the board contacts and alignment is checked. The resulting assembly is heated to melt the board contact solder and cooled. The templates are then removed and replacement of the component is complete.

BRIEF DESCRIPTION OF THE DRAWINGS

Details of the invention, and of preferred embodiments thereof, will be further understood upon reference to the figures, wherein.

DETAILED DESCRIPTION OF PREFERRED EMBODIMENTS

Figure 1:
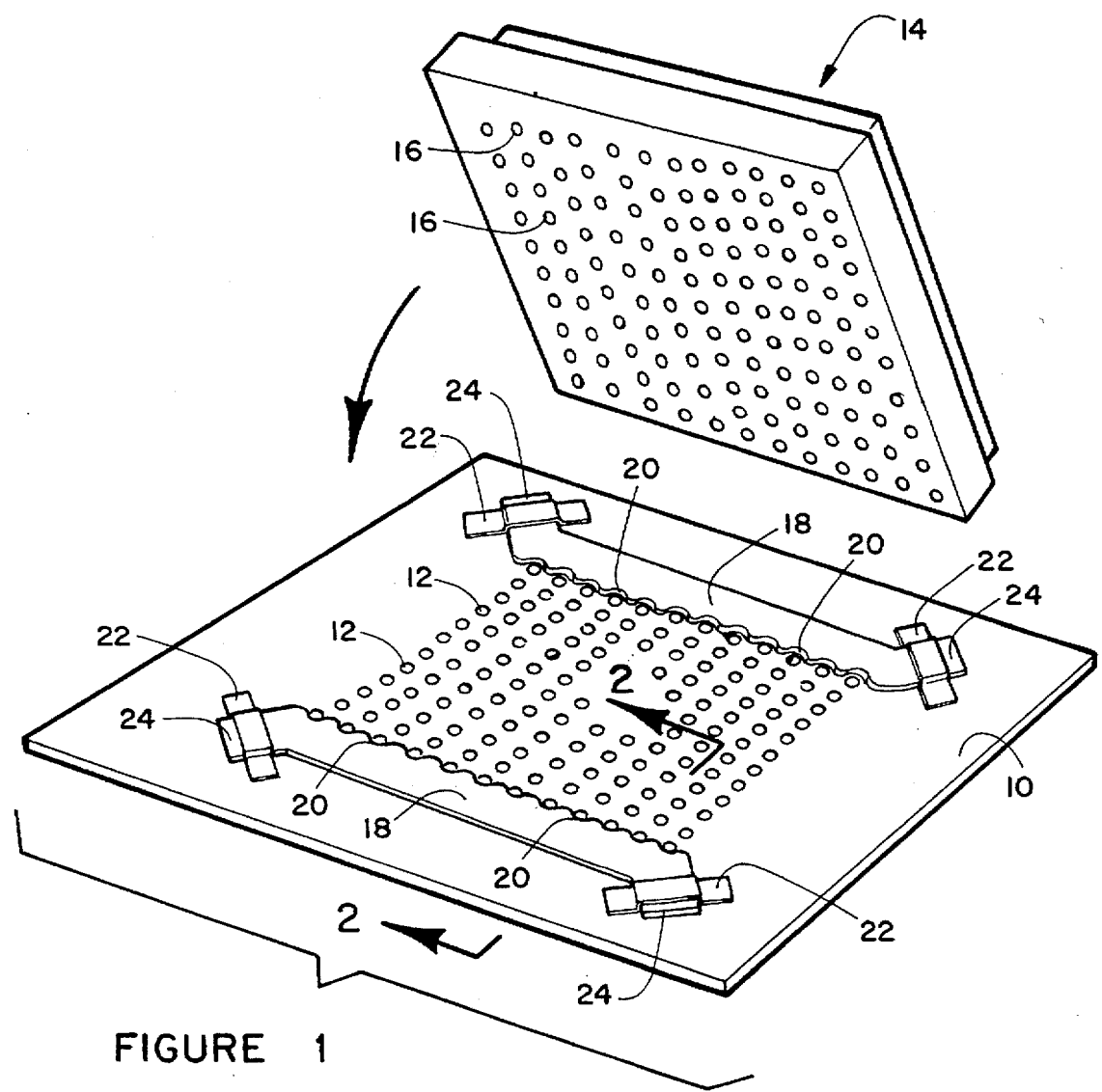
FIG. 1 is a perspective view of the alignment apparatus and a component to be mounted.
Figure 2:
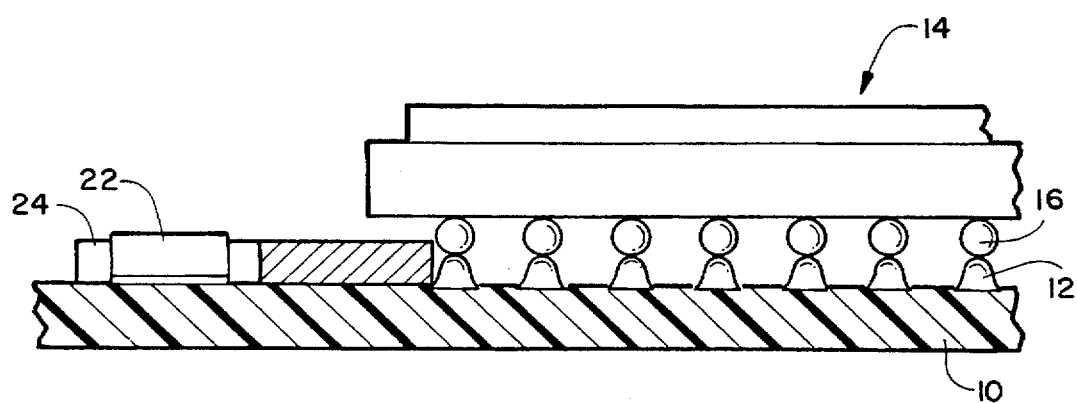
FIG. 2 is a section view taken on line 2—2 in FIG. 1 with the electronic component placed on the board.

Referring to FIGS. 1 and 2, there is seen a printed circuit board 10 bearing an array of solder pads 12 connected through or along board 10 to various components. In this embodiments, solder pads are generally round and arranged in the grid pattern generally known as a "ball grid array" arrangement. An electronic component 14 bears an array of solder balls or bumps 16 across the undersurface that precisely corresponds to the solder pad array 12 on board 10. Balls 16 may be formed from any suitable solder, including high melting temperature or lower melting temperature eutectic solders.

Two thin templates 18 of sheet material each have a series of indentations 20 configured and spaced to precisely match the size and spacing of solder pads 12. Templates 18 may be formed from any suitable material that is not wet by molten solder and which will resist solder melting temperatures. For best results, stainless steel is preferred. Templates 18 may have any suitable thickness. The templates should not be so thick as to engage the surface of component 14 when the component is placed on the board, but should have a sufficient thickness that it will engage the midpoint of solder balls 16 as seen in FIG. 2. The optimum template thickness will essentially equal the thickness of solder pads 12 plus the radius of balls 16. The templates will also support component edges as the solder melts, preventing excessive collapse of the component toward the board and maintain a uniform spacing between board and component.

Where new components 14 are to be mounted on a board 10, in short run manufacturing, etc. the pads will be of uniform thickness. In rework, the solder pads 12 may need to be redressed, as indicated in block 30 in FIG. 5, removing excess solder and/or adding solder where needed and heating to produce pad uniformity.

Figure 5:
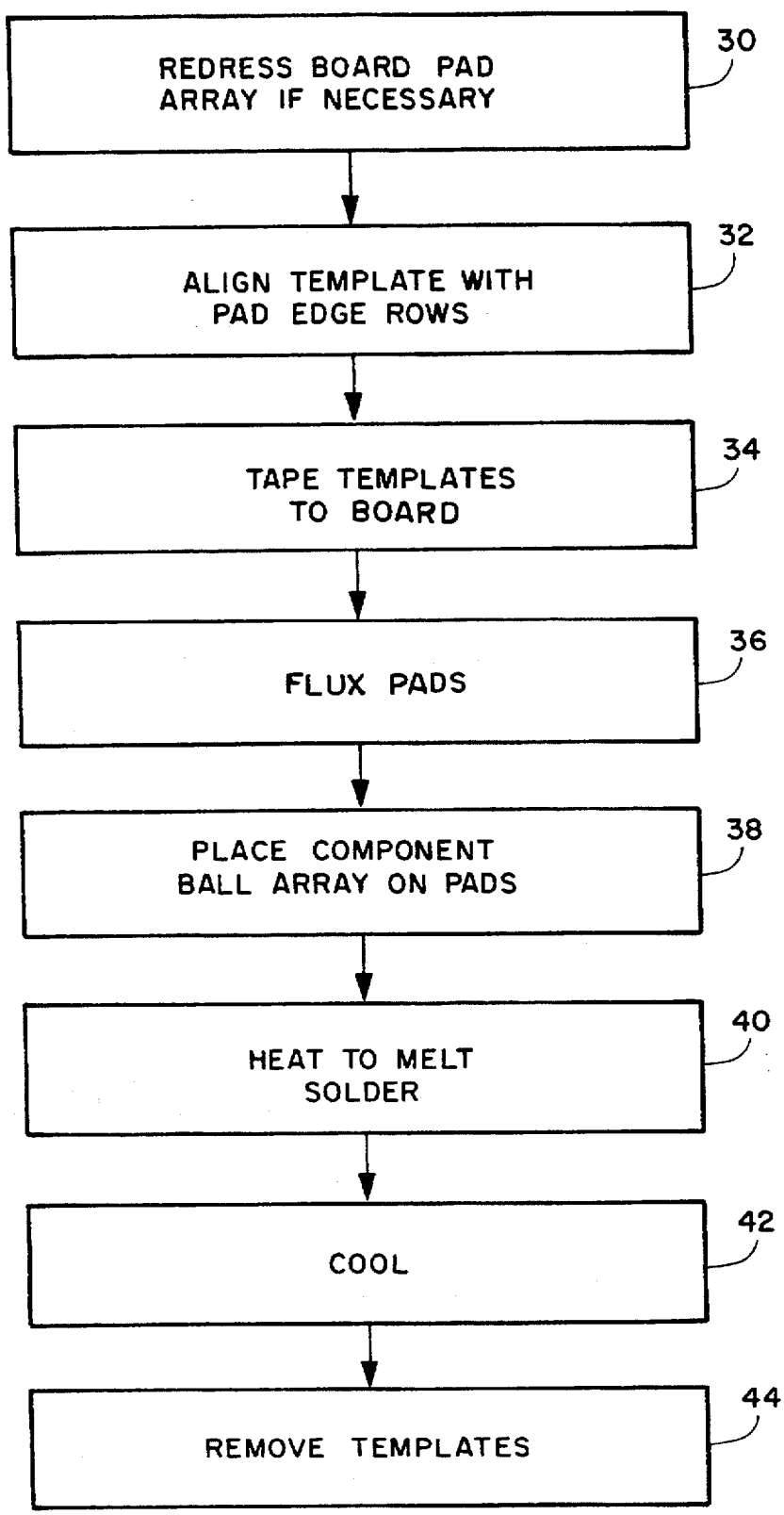
FIG. 5 is a schematic flow diagram of the method of this invention.

Templates 18 are laid on the surface of board 10, then adjusted visually to aligned with the edge row of solder pads 12, as indicated in block 32 of FIG. 5. Tape 22 is then applied over the template to board interface to hold the templates in place, as shown in block 34 of FIG. 5. For best results, narrow tabs 24 are formed at the ends of templates 18, angled away from the side of the templates bearing indentation 20, so that the tape can extend entirely across the tabs and more securely affix the templates to board 10. Tape 22 should be formed from a material that will resist being heated to the melting temperature of solder pads 12. For best results, a polyimide tape is preferred.

A suitable flux is then applied to solder pads, as shown in block 36 of FIG. 5.

The component 14 bearing solder balls 16 to be bonded to solder pads 12 is then placed with outer ball rows in engagement with templates 18, as indicated in block 38. If misalignment is detected, component 14 can be removed, tape 22 removed and the templates readjusted and retaped. Once proper alignment is achieved, which will generally occur on the first setup, the assembly is heated to the melting temperature of solder pads 12 and/or solder balls 16, as shown in block 40. After cooling, (block 42) templates 18 are removed (per block 44), any flux is cleaned off and the assembly is ready for use. The strips may be cleaned of any flux and can be reused indefinitely.

Figure 3:
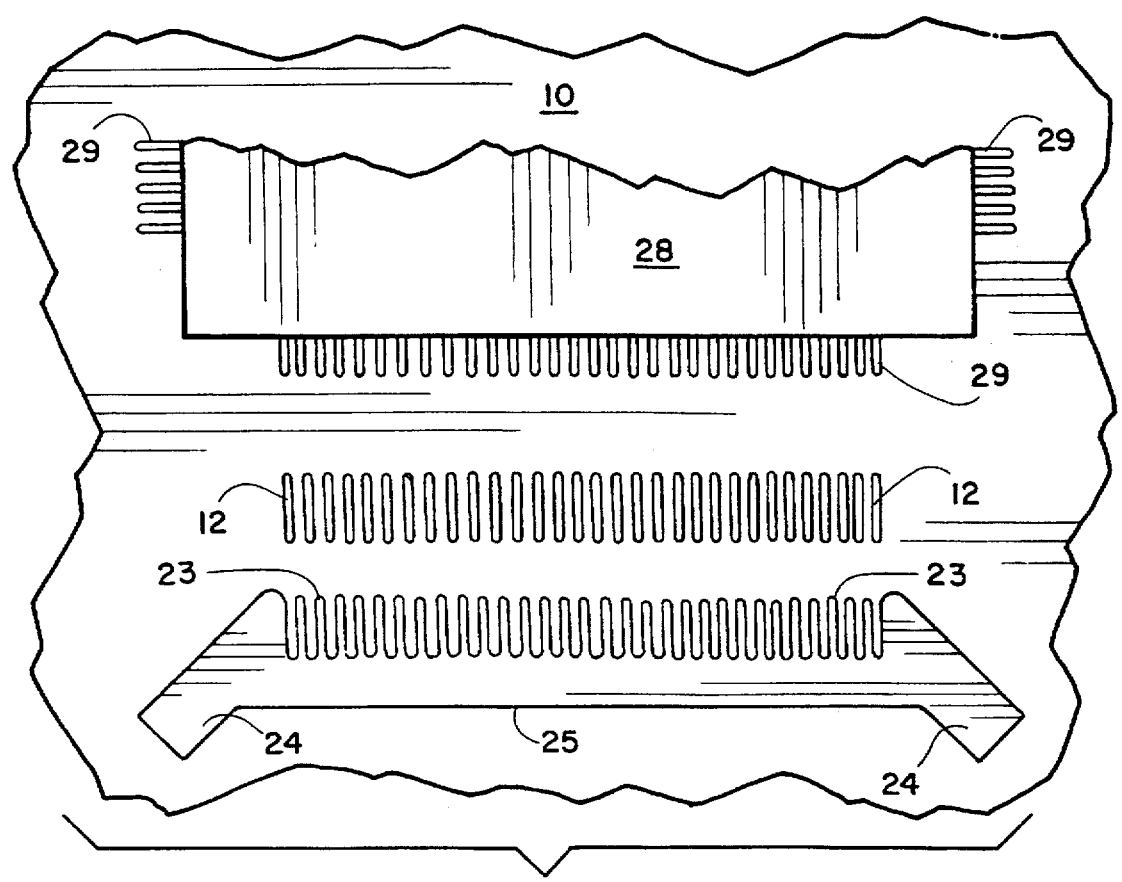
FIG. 3 is a detail plan view of an alternate embodiment of a template for use with a linear contact array.
Figure 4:
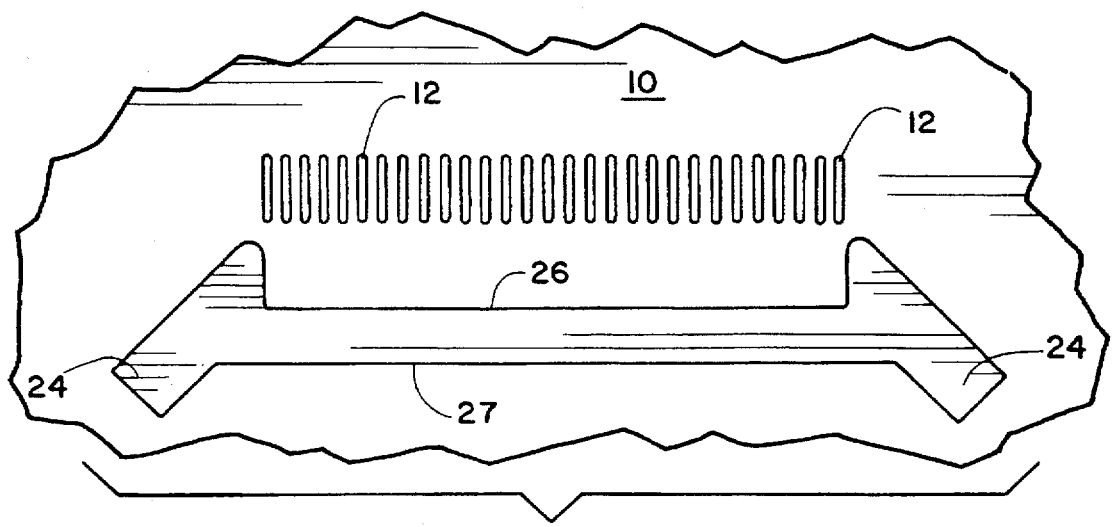
FIG. 4 is a second alternate embodiment of a template for use in a linear contact array.

As seen in FIG. 3, where an electronic component 28 is of the type having a linear array of parallel, closely spaced wires to be bonded to a corresponding linear array of closely spaced elongated solder pads 12 on a board sized and configured to match the solder pads. Template 25 preferably has a plurality of finger-like extensions 23 that fit between the pads 12 and leads 29. Such a template is preferably made by chemical etching to achieve the fine detail required to receive the leads 29 of component 28. The template 25 may if desired simply have a series of small indentations corresponding to the outer ends of the solder pads with the template having a configuration similar to that shown in FIG. 1. In some cases, as seen in FIG. 4, I have found that it is also effective to have a template, 27, with a single long indentation 26 to receive all of the solder pads 12 in the array. This single indentation is suitable where the leads are relatively strong, since all bending forces during alignment and soldering tend to be against the endmost leads.

While certain specific relationships, materials and other parameters have been detailed in the above description of preferred embodiments, those can be varied, where suitable, with similar results. Other applications, variations and ramifications of the present invention will occur to those skilled in the art upon reading the present disclosure. Those are intended to be included within the scope of this invention as defined in the appended claims.

I claim:

1. An alignment apparatus for aligning an electronic component with a base member, both of which have complementary patterns of multiple contact members, which comprises:

two thin templates of sheet material, each having end tabs and indentations along a first edge;

said template indentations sized and configured to align with complementary contact members on first and second electronic components to be aligned for bonding together, and means for releasably bonding said end to said first electronic component;

whereby contact members on said second electronic component can be brought into contact with corresponding contact members on said first electronic component with said contact members on said components engaging said templates to assure precise alignment between said corresponding contact members.

2. The alignment apparatus according to claim 1 wherein said contact members on said first electronic component comprise generally round solder pads having a predetermined thickness on a printed circuit board and said template indentations are partially circular.

3. The alignment apparatus according to claim 2 wherein said contact members on said second electronic component have a generally ball shaped configuration and said second electronic component is ball grid array component.

4. The alignment apparatus according to claim 3 wherein said templates have thicknesses approximately equal to said solder pad predetermined thickness plus the radius of said ball shaped electronic component contact members.

5. The alignment apparatus according to claim 1 wherein said contact members on said first electronic component comprise at least one parallel linear array of closely spaced parallel elongated solder pads on a printed circuit board and said template indentations are configured to engage said linear arrays.

6. The alignment apparatus according to claim 5 wherein said contact members on said second electronic component have a configuration corresponding to said elongated solder pads and are arranged along at least two opposite parallel edges of said second electronic component.

7. The alignment apparatus according to claim 6 wherein said second electronic component has a linear array of short parallel solder balls.

8. The alignment apparatus according to claim 7 wherein said template has a plurality of parallel fingers sized and configured to fit between said elongated solder pads.

9. The alignment apparatus according to claim 7 wherein said template has a single indentation sized and configured to fit around three sides of said parallel liner array.

10. The alignment apparatus according to claim 1 wherein said templates include tabs extending away from said first edge in the plane of said template.

11. The alignment apparatus according to claim 1 wherein said means for releasably bonding said templates to said first component comprise pressure sensitive tape.

12. A method for aligning an electronic component with a base member, both of which have complementary patterns of multiple contact members, which comprises the steps of:

providing two thin templates of material each having an indention along a first edge sized and configured to align with complementary solder contact members on first and second electronic components;

positioning templates along at least two sides of said first electronic component;

visually aligning said template indentations with contact members on said first electronic component along said two sides;

releasably bonding said templates to said first electronic component;

placing said second electronic component in contact with said template indentations with said contact members of each component in contact;

heating the resulting assembly to the melting temperature of said solder contact members;

cooling said assembly to a temperature below the melting temperature of said solder contact members; and removing said templates.

13. The method according to claim 12 wherein said templates are releasably bonded to said first electronic component by applying pressure sensitive tape across the template and first electronic component interface.

14. A method of removing and replacing ball grid array components on a printed circuit board which comprises the steps of:

providing a first ball grid array electronic component bonded to a printed circuit board by corresponding arrays of solder balls on said component and solder pads on said printed circuit board;

heating said first component to the melting temperature of said solder pads;

lifting said first component away;

repairing said solder pads, if needed;

providing two templates of sheet material having a series of rounded indentations along one edge that correspond in spacing and shape to edge rows of said solder pads;

placing said templates with said indentations along two sides of said solder pad array;

visually aligning said indentations with two said edge rows;

releasably bonding said templates to said printed circuit board;

placing a second ball grid array component corresponding to said removed first component with edge rows of balls aligned with said indentations; and heating the resulting assembly to the melting temperature of said pads.

15. The method according to claim 12 wherein said templates are releasably bonded to said printed circuit board by applying pressure sensitive tape across the template and printed circuit board interface.

* * * * *